US008368400B2

(12) United States Patent
Haas et al.

(10) Patent No.: US 8,368,400 B2
(45) Date of Patent: Feb. 5, 2013

(54) MAGNETIC RESONANCE SELECTIVE EXCITATION METHOD OF A TARGET DISTRIBUTION OF MAGNETIZATION WITH COMPLETE FULL INTEGRATION OF BLOCH EQUATIONS FOR RF LARGE ANGLE PULSES (LAP)'S THAT ARE 15 DEGREES OR GREATER, WITHOUT SMALL ANGLE APPROXIMATION

(75) Inventors: Martin Haas, Freiburg (DE); Maxim Zaitsev, Freiburg (DE); Jürgen Hennig, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 738 days.

(21) Appl. No.: 12/382,202

(22) Filed: Mar. 11, 2009

(65) Prior Publication Data
US 2009/0302838 A1    Dec. 10, 2009

(30) Foreign Application Priority Data

Mar. 19, 2008  (DE) .......................... 10 2008 015 054

(51) Int. Cl.
*G01V 3/00* (2006.01)
(52) U.S. Cl. ........................ 324/314; 324/308; 324/307
(58) Field of Classification Search .......... 300/300–322; 382/128–131; 600/407–435; 324/300–322
See application file for complete search history.

(56) References Cited

U.S. PATENT DOCUMENTS

| | | | | |
|---|---|---|---|---|
| 4,742,303 | A | * | 5/1988 | Bendall .......................... 324/309 |
| 4,985,677 | A | * | 1/1991 | Pauly ............................ 324/309 |
| 5,105,152 | A | | 4/1992 | Pauly |
| 5,196,795 | A | * | 3/1993 | Bodenhausen et al. ........ 324/309 |
| 5,572,126 | A | * | 11/1996 | Shinnar ......................... 324/314 |
| 6,094,049 | A | | 7/2000 | Rosenfeld |
| 6,448,769 | B1 | * | 9/2002 | Rosenfeld et al. ............. 324/309 |
| 6,564,082 | B2 | * | 5/2003 | Zhu ............................... 600/410 |

(Continued)

OTHER PUBLICATIONS

Xu Dan et al. "Designing multichannel, multidimensional, arbitrary flip angle RF pulses using an optimal control approach", Magnetic Resonance in Medicine, Academic Press, Duluth, MN, US, vol. 59, No. 3, Mar. 1, 2008, pa. 547-560.

(Continued)

*Primary Examiner* — Melissa Koval
*Assistant Examiner* — Tiffany Fetzner
(74) *Attorney, Agent, or Firm* — Paul Vincent

(57) ABSTRACT

A magnetic resonance method for using radio frequency pulses for spatially selective and frequency selective or multidimensionally spatially selective excitation of an ensemble of nuclear spins with an initial distribution of magnetization in a main magnetic field aligned along a z-axis, wherein a spin magnetization with a given target distribution of magnetization is generated, and for refocusing the spin magnetization, is characterized in that the radio frequency pulse is used as a sequence of sub-pulses of independent duration, courses of gradients and spatial and/or spectral resolution, comprising one or more large angle RF pulses with tip angles greater than or approximately equal to 15°, which generate a gross distribution of magnetization approximating the target distribution of magnetization or a desired modification of the distribution of magnetization with a mean deviation less than or approximately equal to 15°, wherein the actual effect of the LAPs on the distribution of spin magnetization before the radio frequency pulse is used is calculated by integration of the Bloch equations without small angle approximation, and one or more small angle RF pulses=SAPs with tip angles less than or approximately equal to 15° reducing the difference between the target distribution of magnetization and the gross distribution of magnetization caused by the LAPs.

14 Claims, 5 Drawing Sheets

U.S. PATENT DOCUMENTS

| | | | | |
|---|---|---|---|---|
| 6,750,649 | B1* | 6/2004 | Rosenfeld | 324/307 |
| 6,915,152 | B2* | 7/2005 | Zhu | 600/410 |
| 6,989,673 | B2* | 1/2006 | Zhu | 324/318 |
| 7,053,618 | B2* | 5/2006 | Zhu | 324/318 |
| 7,075,301 | B2* | 7/2006 | Zhu | 324/318 |
| 7,075,302 | B2* | 7/2006 | Zhu | 324/318 |
| 7,275,010 | B2 | 9/2007 | Mitschang | |
| 7,466,131 | B1* | 12/2008 | Xu et al. | 324/318 |
| 7,705,594 | B2* | 4/2010 | Xu et al. | 324/307 |
| 7,777,488 | B2* | 8/2010 | Gore et al. | 324/309 |
| 8,063,637 | B2* | 11/2011 | Xu et al. | 324/314 |
| 2003/0004408 | A1* | 1/2003 | Zhu | 600/410 |
| 2003/0004410 | A1* | 1/2003 | Zhu | 600/422 |
| 2005/0110487 | A1* | 5/2005 | Zhu | 324/309 |
| 2005/0110488 | A1* | 5/2005 | Zhu | 324/309 |
| 2005/0134267 | A1* | 6/2005 | Zhu | 324/309 |
| 2005/0134268 | A1* | 6/2005 | Zhu | 324/309 |
| 2008/0238425 | A1* | 10/2008 | Xu et al. | 324/322 |
| 2009/0302838 | A1* | 12/2009 | Haas et al. | 324/307 |
| 2010/0253336 | A1* | 10/2010 | Schneider et al. | 324/309 |
| 2010/0264926 | A1* | 10/2010 | Xu et al. | 324/313 |
| 2011/0080169 | A1* | 4/2011 | Haas et al. | 324/309 |
| 2011/0128000 | A1* | 6/2011 | Harvey | 324/307 |

OTHER PUBLICATIONS

Katscher U, et al. "Transmit Sense", Magnetic Resonance in Medicine, Academic Press, Duluth, MN, US, vol. 49, Nr. 1, Jan. 1, 2003, pa. 144-150.

Tony Stoecker et al. "HPC Simulation of Magnetic Resonance Imaging", Parallel Computing: Architectures, Algorithms and Applications (In: NIC Serie), IOP Press, vol. 38, Jan. 1, 2008, pa. 155-164.

Chun-Yu Yip et al. "Joint Design of Trajectory and RF Pulses for Parallel Excitation", Magnetic Resonance in Medicine, Academic Press, Duluth, MN, US, vol. 58, Jan. 1, 2007, pa. 598-604.

Ullmann P et al. "Experimental Analysis of Parallel Excitation Using Dedicated Coil Setups and Simultaneous RF Transmission on Multiple Channels", Magnetic Resonance in Medicine, Academic Press, Duluth, MN, US, vol. 54, Jan. 1, 2005, pa. 994-1001.

Zhu Y "Parallel Excitation With an Array of Transmit Coils", Magnetic Resonance in Medicine, Academic Press, Duluth, MN, US, vol. 51, Jan. 1, 2004, pa. 775-784.

Ayman M. Rhalifa, Abou-Bakr M., Yasser M. Kadah, "Optimal Design of RF Pulses with Arbitrary Profiles in Magnetic Resonance Imaging". 2001 Proceedings of the 23rd Annual EMBS international Conference, Oct. 25-28, Istanbul, Turkey, p. 2296 ff.

W.A. Grissom, J.A. Fessler, D.C. Noll, "Additive-Angle Method for Fast Large-Tip-Angle RF Pulse Design in Parallel Excitation". Proc. Intl. Soc. Mag. Reson. Med. 15 (2007), p. 1689.

S. Connoly, D. Nishimura, A. Macovski, "Selective Complex Pulse Design by Optimal Control Theory", Proceedings of the $5^{th}$ Annual Meeting SMRM, Montreal, Canada 1456-1457 (1986).

Dan Xu, Kevin F. King, Yudong Zhu, Graeme C. McKinnon, Zhi-Pei Liang, "Designing Multichannel, Multidimensional, Arbitrary Flip Angle RF Pulses Using an Optimal Control Approach", Magnetic Resonance in Medicine 59:547-560 (2008).

Ulrich Katscher, Peter Boernert, Christoph Leussler, Van Den Brink, "Transmit Sense", Magnetic Resonance in Medicine 49:144-150 (2003).

Yudong Zhu, "Parallel Excitation With an Array of Transmit Coils", Magnetic Resonance in Medicine 51:775-784 (2004).

Peter Ullmann, Sven Junge, Markus Wick, Frank Seifert, Wolfgang Ruhm, Juergen Hennig, "Experimental Analysis of Parallel Excitation Using Dedicated coil Setups and Simultaneous RF Transmission on Multiple Channels", Magnetic Resonance in Medicine 54:994-1001 (2005).

Eliot T, Lebsack, Steven M. Wright, "Iterative RF Pulse Refinement for Magnetic Resonance Imaging", IEE Transactions on Biomedical Engineering, vol. 49, No. 1. Jan. 2002, p. 41 ff.

* cited by examiner

Fig. 1
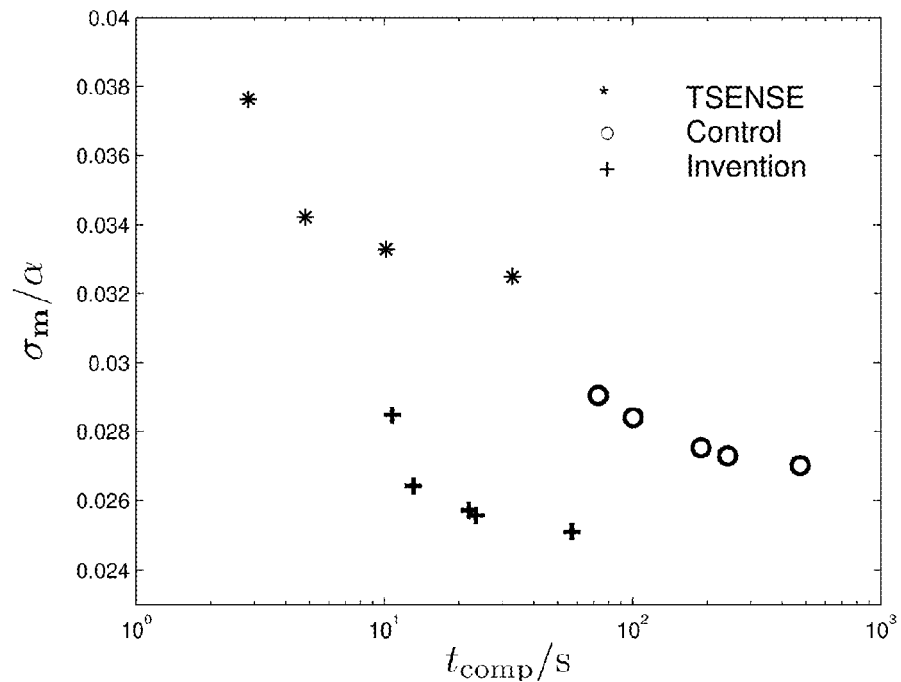
Fig. 2a
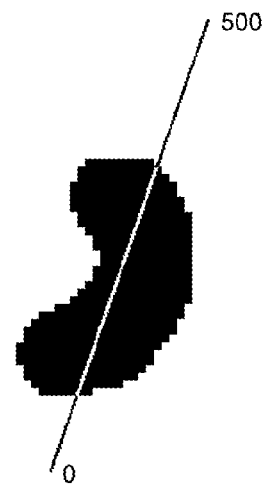
Fig. 2b

MAGNETIC RESONANCE SELECTIVE EXCITATION METHOD OF A TARGET DISTRIBUTION OF MAGNETIZATION WITH COMPLETE FULL INTEGRATION OF BLOCH EQUATIONS FOR RF LARGE ANGLE PULSES (LAP)'S THAT ARE 15 DEGREES OR GREATER, WITHOUT SMALL ANGLE APPROXIMATION

This application claims Paris Convention priority of DE 10 2008 015 054.1 filed Mar. 19, 2008 the complete disclosure of which is hereby incorporated by reference.

BACKGROUND OF THE INVENTION

The invention concerns a magnetic resonance method for using radio frequency pulses for spatially selective and frequency selective or multidimensionally spatially selective excitation of an ensemble of nuclear spins having an initial distribution of magnetization in a main magnetic field aligned along a z-axis, wherein a spin magnetization with a given target distribution of magnetization is generated, and for a correspondingly selective refocusing of the spin magnetization. Such a method is known from [4].

Use of radio frequency (=RF) pulses generated by RF coils in conjunction with magnetic field gradients is the standard slice selection method in magnetic resonance imaging, wherein the gradients are temporally constant and the RF pulses have a sinc(t)-like envelope. This method can be understood as excitation along a k-space line.

Multidimensional spatial selection therefore requires passing through k-space in the appropriate dimensionality during excitation, which has so far been extremely difficult to do in feasible time (<20 ms) due to slew-related limitations (hardware and nerve stimulation). The emergence of parallel excitation techniques, however, has allowed the pulse duration to be shortened during excitation by using several spatially inhomogeneous emitting coils, and spatially selective excitation and refocusing in 2 and 3 dimensions or in conjunction with a frequency dimension are becoming feasible. [1] demonstrates first experimental configurations and shows the state of the art in the small angle region.

Spatially selective excitation in several dimensions is designed for applications such as inner volume imaging, outer volume saturation or spectroscopy, wherein an arbitrary (anatomically) formed region of the sample/the test person (target sample) is selected and only that particular region is excited or refocused. This type of selective excitation therefore requires specific calculation of RF pulses for each target sample. Furthermore, the emitting profiles of the RF coils are specific for each patient, so the RF pulses additionally depend on the measured emitting profiles, which are only available when the patient is already in the tomograph. Consequently, a highly important criterion for the applicability of anatomically adjusted spatially selective excitation in addition to the accuracy of the excitation pattern is the time needed to calculate the RF pulses.

The Bloch Equations describe the time dependent distribution of spin magnetization M in the fields B0 (main magnetic field), B1 (radio frequency field) and magnetic field gradients G as follows (letters in bold print represent vectorial values):

$$\frac{\partial}{\partial t}M = \begin{pmatrix} 0 & \Delta\omega & -\gamma B_{1,x} \\ -\Delta\omega & 0 & \gamma B_{1,y} \\ \gamma B_{1,x} & -\gamma B_{1,y} & 0 \end{pmatrix} M \quad (1)$$

wherein M, B1 and $\Delta\omega$ are position and time dependent. The following applies to an isochromate: $\Delta\omega(t, r) = \gamma[r \cdot G(t) - \Delta B0(r)]$, wherein the spatially varying off-resonance term $\Delta B0(r)$ describes inhomogeneities in the main magnetic field. T1 and T2 relaxation are neglected here.

For the purpose of multidimensionally selective excitation, the Bloch Equations in form (1) are regarded as a discretized system of differential equations with Ns (number of points at which the target distribution of magnetization is given (grid points)) vector equations and with Nc (number of RF coils) multiplied by Nt (number of time increments) degrees of freedom to determine the RF pulses Il(t) associated with the field B1 via the emitting profiles of the coils.

Two main approaches to solving this system of equations are described in literature:

1. Optimal control [2,3], which provides high accuracy of the excitation pattern. This approach is based on solving the system of equations (1) using methods of variational calculus and requires a complete forward solution (integration) of the Bloch Equations per RF optimization step (iteration) to determine the excitation error and a complete backward integration to obtain the RF pulse optimized by one step. This method is exact but, with typical calculation times of up to 15 minutes on state-of-the-art computers, too time-consuming and CPU-intensive for a feasible solution. It is therefore not suited for use in clinical routines where the fastest method with appropriate accuracy must be chosen.

2. Transmit SENSE [1,4,5] (in small tip angle approximation), which is based on approximation of the Bloch Equations for small tip angles. This approximation reduces solving the Bloch Equations to solving a linear equation in Il (RF amplitude and phase of the l-st coil) for transverse magnetization Mt:

$$M_t(r) = i\gamma M_0(r) \int_0^T dt \sum_l S_l(r) I_l(t) \exp[i(k(t) \cdot r + \Delta\omega_0(r)(T-t))] \quad (2)$$

wherein Sl represent the emitting profiles of the RF coils, T represents the total duration of the RF pulse, M0 represents the magnetization toward the z-axis at the onset of the pulse (t=0), k(t) represents the k-space trajectory resulting from the course of the gradients G(t), and $\Delta\omega 0(r)$ represents the off resonance resulting from the inhomogeneity of the B0 field. The emitting profiles, the transverse magnetization and the RF are complex quantities: each of the x-components is represented by the real part and each of the y-components by the imaginary part.

The linearity of this remaining problem and the fact that the equations decouple for the z-components of the magnetization, allow relatively quick and simple calculation of the RF pulses. The inherent small angle approximation, however, rules out exclusive use of this method of calculation for pulses with large tip angles >15°, which are indispensable for efficient excitation of the spin magnetization and for all spin-echo-based sequences.

The present invention is based on the task of improving a method of the kind described in the introduction so as to help avoid the disadvantages described above.

SUMMARY OF THE INVENTION

According to the invention, this task is fulfilled in an effective manner by using the radio frequency pulse as a sequence of sub-pulses of independent duration, courses of gradients and spatial and/or spectral resolution, comprising one or more large angle RF pulses=LAPs with tip angles greater than or approximately equal to 15°, which generate a gross distribution of magnetization approximating the target distribution of magnetization or a desired modification of distribution of magnetization with a mean deviation less than or approximately equal to 15°, wherein the actual effect of the LAP on the distribution of spin magnetization before the radio frequency pulse is used is calculated by integration of the Bloch Equations without small angle approximation, and one or more small angle RF pulses=SAPs with tip angles less than or approximately equal to 15°, which reduce the difference between the target distribution of magnetization and the gross distribution of magnetization generated by the LAPs.

In single- or multiple-channel transmit mode, the exciting RF pulse can be generated using a homogeneous or inhomogeneous emitting profile and consists of a sequence of several RF pulses as described above. The large angle RF pulses only roughly generate the desired target distribution of magnetization or the desired modification of magnetization (with mean deviations ≦15°), while the small angle RF pulses reduce the difference between the target distribution of magnetization and the gross distribution of magnetization caused by the large angle RF pulses. Target distribution of magnetization in this context means the distribution of spin magnetization within a target pattern that is to be generated using the RF pulse or into which the initial distribution of magnetization is to be converted using the RF pulse. The sequence of LAPs and SAPs is not yet determined due to their described function, in particular, an SAP can correct in advance the gross distribution of magnetization which would be caused by exclusive use of an LAP.

According to the invention, the method consists in first integrating the Bloch Equations without small angle approximation to calculate the exact distribution of magnetization caused by the large angle RF pulses. According to the invention, the method also envisions that the small angle RF pulses are calculated quickly and exactly in small transverse magnetization (STM) approximation. Due to the fact that the method involves integration of the Bloch Equations and the SAPs are calculated within the valid range of STM approximation, the accuracy of the method can be ensured, making it superior to exclusive use of the small angle approximation.

The same circumstance furthermore allows fast calculation, as the Bloch integration must only be carried out one single time (or as many times as the sequence contains LAPs) and not twice for each of a larger number of iterations, as in optimal control.

Preferably, the SAPs are determined by solving the Bloch Equations in small transverse magnetization approximation, i.e. with components perpendicular to the z-axis which are considerably smaller than the component parallel to the z-axis (small transverse magnetization=STM), wherein the approximation is valid for an ensemble of nuclear spins which contains magnetization vectors with angles both near to 0° and near to 180° relative to the +z-axis. The z-axis is thereby defined by the direction of the main magnetic field of an MR magnet used in the method.

The STM approximation used in this embodiment of the method according to the invention can be used for an ensemble of nuclear spins where one part of the magnetization vectors may deviate from the +z-axis (0°) by ≦15° while the other part may deviate from the −z-axis (180°) by ≦15°, wherein an additional degree of freedom compared to the conventional small angle method can be obtained, in particular by the chosen sequence of SAPs and LAPs. This enables quick and exact calculation of small angle sub-pulses in small transverse magnetization (STM) approximation.

In an advantageous embodiment, LAPs are generated by increasing the amplitude of those RF pulses that were calculated in STM or small angle approximation, as this enables quick calculation of the LAPs as opposed to using the conventional optimal control method.

In an advantageous embodiment of the method according to the invention, the spin magnetization is converted from an initial distribution of magnetization, where the magnetization vectors are aligned along the z-axis, into the target distribution of magnetization by means of an SAP and a subsequent LAP by backward integration of the Bloch Equations, starting from the target distribution of magnetization, and by setting the difference between the thus calculated distribution of magnetization and the initial distribution of magnetization as a new target distribution of magnetization to be generated for the SAP. The initial distribution of magnetization represents the distribution of magnetization of the ensemble of nuclear spins before an RF pulse is used. The advantage of an SAP-LAP sequence is that the magnetization vectors of the target distribution of magnetization, unlike an LAP-SAP sequence, may have arbitrary angles with respect to the +z-axis.

Another embodiment of the invention envisions that the spin magnetization is converted from an initial distribution of magnetization into a target distribution of magnetization, where the magnetization vectors are aligned along the z-axis, by means of an LAP and a subsequent SAP by forward integration of the Bloch Equations, starting from the initial distribution of magnetization, and by setting the difference between the target distribution of magnetization and the thus calculated distribution of magnetization as a new target distribution of magnetization to be generated for the SAP. The advantage of this method is the re-use of transverse components of the distribution of magnetization for subsequent new excitation.

Another advantageous embodiment of the method according to the invention envisions that the spin magnetization is rotated by 180° from an initial distribution of magnetization, where the magnetization vectors are aligned along the z-axis. Selective rotation by 180° is especially advantageous when using spin-echo-based imaging methods and when preparing contrast imaging by inverting the spin magnetization. This embodiment of the method according to the invention allows spin-echo-based imaging, inversion recovery and similar methods with the appropriate selectivity (spatially and frequency selective or multidimensionally spatially selective) to be used.

Preferably, the initial distribution of magnetization is rotated by means of an SAP and a subsequent LAP using the following procedure. The spin magnetization is converted from an initial distribution with which the magnetization vectors are aligned along the z-axis, into the target distribution of magnetization by means of an SAP and a subsequent LAP by backward integration of the Bloch Equations, starting from the target distribution of magnetization, and by setting the difference between the thus calculated distribution of magnetization and the initial distribution of magnetization as a new target distribution of magnetization to be generated for the SAP.

However, it is also possible for the initial distribution of magnetization to be rotated by means of an LAP and a subsequent SAP using forward integration of the Bloch Equations and setting the difference between the initial distribution of magnetization rotated by 180° and the thus calculated distribution of magnetization as a target distribution of magnetization to be generated for the SAP.

Alternatively, the initial distribution of magnetization can be rotated by means of a first SAP, followed by an LAP, followed by a second SAP using backward integration of the Bloch Equations, starting from the initial distribution of magnetization rotated by 180°, and setting the difference between the thus calculated distribution of magnetization and the initial distribution of magnetization as a new target distribution of magnetization to be generated for the first SAP, and using forward integration of the Bloch Equation for the "first SAP-LAP" sequence, starting from the initial distribution of magnetization, and by setting the difference between the initial distribution of magnetization rotated by 180° and the thus calculated distribution of magnetization as a new target distribution of magnetization to be generated for the second SAP. This embodiment of the method according to the invention has the advantage that the deviations of the distribution of magnetization of the ensemble of nuclear spins from the target distribution of magnetization, caused by the LAP, can be reduced in two steps, resulting in even higher accuracy.

In another embodiment of the method according to the invention, the spin magnetization is converted from an initial distribution of magnetization via a distribution of magnetization where the magnetization vectors are aligned along the z-axis into the target distribution of magnetization using an LAP, followed by an SAP, which shifts the spin magnetization to a distribution of magnetization where the magnetization vectors are aligned along the z-axis, followed by an SAP-LAP sequence which generates the target distribution of magnetization. This embodiment is particularly advantageous for refocusing (=reflection of the distribution of magnetization in a plane containing the z-axis) the ensemble of nuclear spins and when used in steady state sequences, where multidimensionally spatially selective RF pulses cannot be used with state-of-the-art technology. Another advantage results from a temporal symmetry of the RF pulse, which renders the method less sensitive compared with B0 off resonances.

It is especially advantageous if the two subsequent SAPs are combined to form one SAP which is shorter than the two subsequent SAPs. Reducing the duration of the total RF pulse sequence has an advantageous effect in that it reduces sensitivity compared with B0 off resonances and in addition increases the overall speed of the imaging process.

In all embodiments of the method, the target distribution of magnetization can be identical with the distribution of magnetization reflected in a plane containing the z-axis mirroring the initial distribution of magnetization. This has the advantage that, after using the RF pulse, prior dephasing of the ensemble of nuclear spins is reversed in part, whereby a spin echo is caused.

In another embodiment, the desired distribution of magnetization is applied to an initial distribution of magnetization that is different from what was assumed when calculating the pulses. An RF pulse is calculated using the method according to the invention, whose application to an ensemble of nuclear spins defines a spatially and frequency selective or a spatially multidimensionally selective rotation of the magnetization vectors of this ensemble, wherein the properties of the rotation process ensure that the vectors of a distribution of magnetization different from the initial distribution of magnetization assumed for the purpose of calculation are also rotated about the same axis by the same angle as the assumed initial distribution of magnetization. This property can be used favorably to use the RF pulses to refocus an unknown initial distribution of magnetization. The method according to the invention is preferably used in NMR tomography and NMR spectroscopy.

Other advantages of the invention can be extracted from the description and the drawing. Also, each of the characteristics mentioned above and below can be used separately or collectively in any combination. The embodiments shown and described must not be understood as an exhaustive list, rather are examples of the description of the invention.

BRIEF DESCRIPTION OF THE DRAWING

FIG. 1 shows a comparison of the accuracy of and the time needed for calculating methods for two-dimensional selective inversion (RF pulse of 180°). The asterisks represent the small angle Transmit SENSE method, the circles represent the optimal control method, and the x represents the method according to the invention. Each method was carried out for several typical iteration depths and/or given accuracies. The mean square deviation $\sigma_m/\alpha$ is derived from the standard deviation of the absolute values of the vector deviations of the spin magnetization from the target distribution of magnetization divided by the tip angle. Calculation time tcomp/s in seconds refers to a state-of-the-art personal computer (Matlab and C in single-core mode on intel core2 duo 2.66 GHz).

FIG. 2a shows a target pattern for two-dimensional selective excitation. The magnetization profiles shown in the figures below run along the marked straight intersection.

FIG. 2b illustrates the two-part k-space trajectory for two-dimensionally selective excitation. The open arrow marks the point of transition between the two sub-pulses in the examples described below. The filled arrow shows the rotation direction of the spiral with increasing time.

DESCRIPTION OF THE PREFERRED EMBODIMENT

FIG. 1 illustrates these statements by means of an example of how a pulse of 180° is calculated for a random target pattern (see FIG. 2a) on a spatial grid with 64×64 grid points. The shape of the k-space trajectory relative to this RF pulse is shown in FIG. 2b with half the number of revolutions and a quarter of the time increments for reasons of clarity. In this example, the SAP is used in the first half of the trajectory [outward spiral from inside k=(0.0) to outside k=(18.0)/cm] while the LAP is used in the second half (inward k-space spiral).

The method according to the invention is described below by way of example on the basis of two-dimensionally selective inversion (tip angle=180°) of a target pattern (FIG. 2a). In this example, rotation of the spin magnetization is to take place such that, at the end of the pulse, each point within the target pattern has been rotated around the x-axis by a total of 180° while no total rotation has taken place outside of the target pattern. In this example, an initial LAP is followed by a subsequent SAP.

Figure 3:
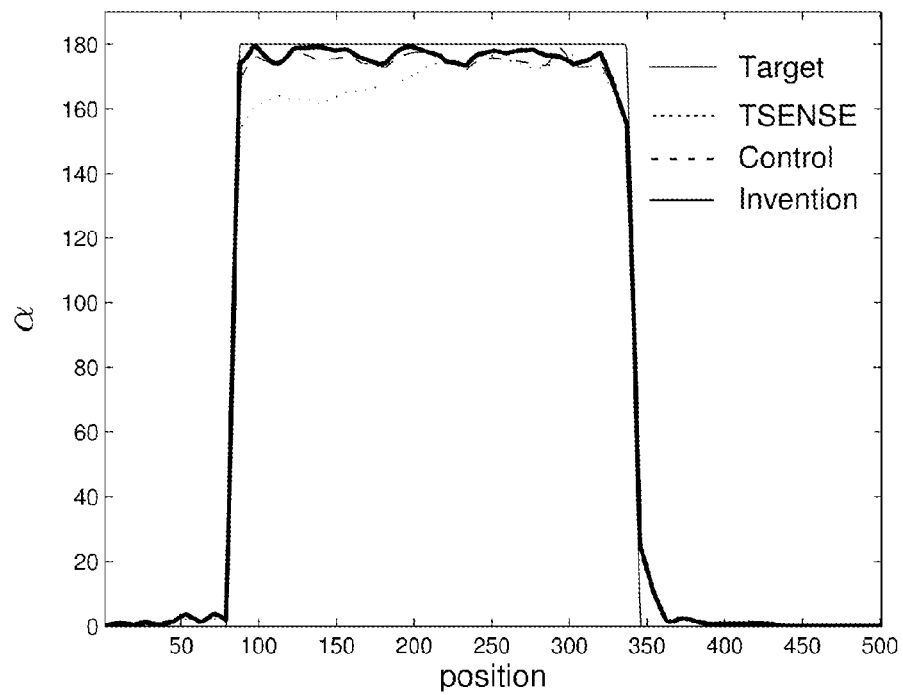
FIG. 3 shows a simulation of the distribution of angles α of the distribution of magnetization relative to the +z-axis along the intersection shown in FIG. 2a. The distribution of angles generated by the various methods are presented by comparison with a target distribution of angles (thin solid line), wherein the dotted line represents the Transmit SENSE method, the broken line represents the optimal control method, and the thick solid line represents the method according to the invention.
Figure 4:
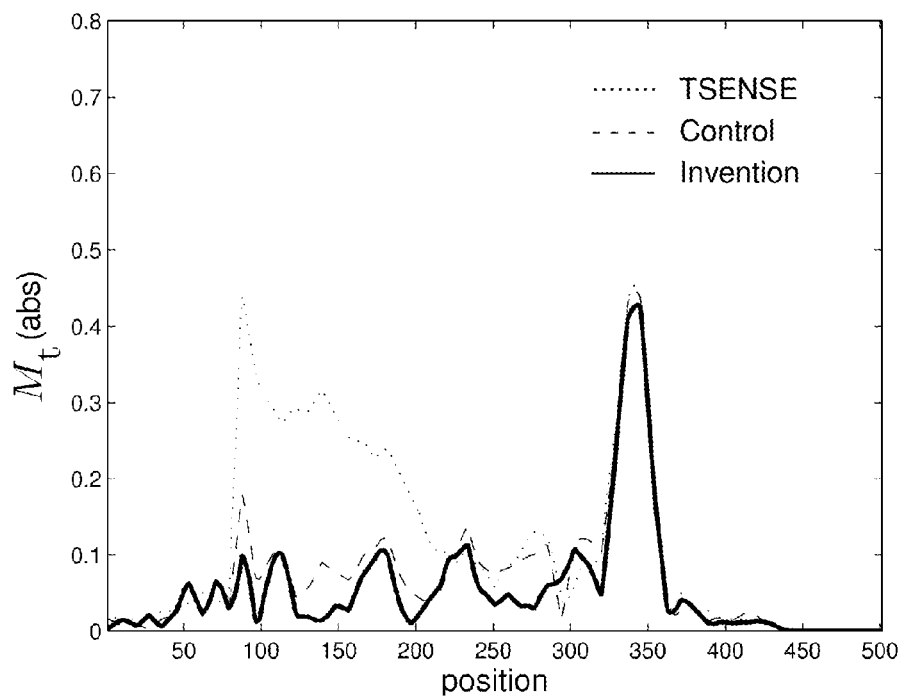
FIG. 4 shows a simulation of the absolute value of transverse magnetization Mt along the intersection shown in FIG. 2a. In this case, the absolute value of the transverse component of the target distribution of magnetization is zero (zero distribution). The dotted line represents the Transmit SENSE method, the broken line represents the optimal control method, and the thick solid line represents the method according to the invention.
Figure 5:
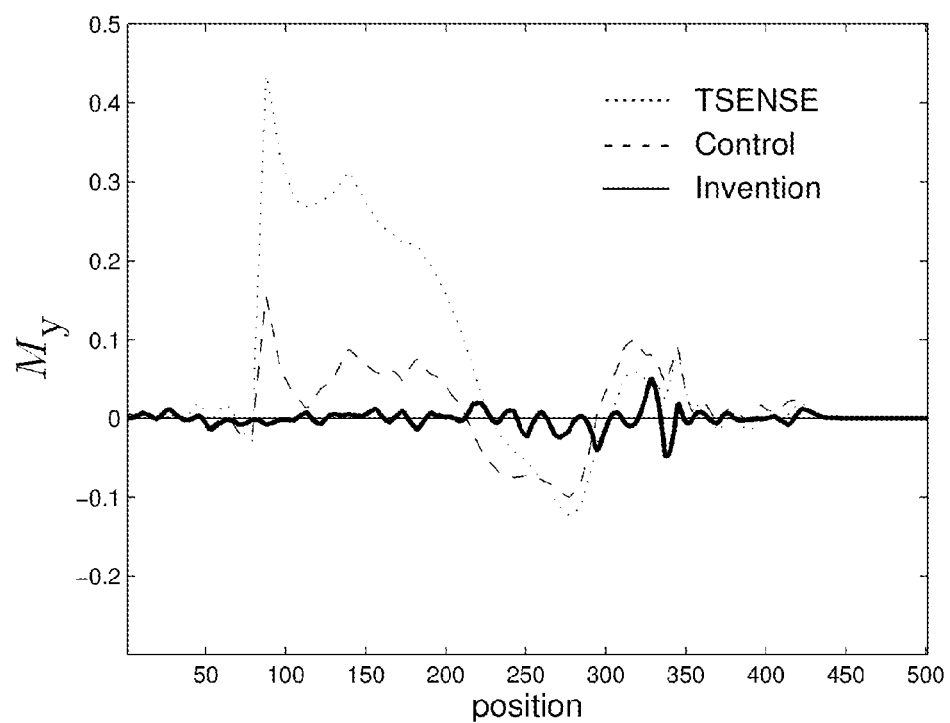
FIG. 5 shows a simulation of the y-component of the magnetization My along the intersection shown in FIG. 2a. In this case, the y-component of the target distribution of magnetization is zero as rotation around the x-axis was given. The dotted line represents the Transmit SENSE method, the broken line represents the optimal control method, and the thick solid line represents the method according to the invention.

The first step consists in solving equation (2) for II(t), wherein the absolute value of Mt(r) is set equal to the distribution of angles of the target distribution of magnetization (with a decreased amplitude of 10° within the target pattern) and the phase of Mt(r) is set to zero, whereby effective rotation around the x-axis is preset. (Note: in small angle approximation, any "rotation" of magnetization is determined by specification of two values and not three as in general. Rotation around the z-axis cannot be generated by the B1 fields). The first half of the trajectory is used in FIG. 2b and measured emitting profiles Sl are used for k(r). The resulting RF pulse forms II(t) are then increased by a factor of 18 and these pulse forms (the LAP) are then used together with the same Sl and k(r) to solve forward equation (1). The resulting M(T/2, r) is adjusted for the position dependent phase which would be generated by the remaining part of the k-space trajectory. The vectorial difference of target distribution of magnetization — M(T/2, r) is a non-infinitesimal distribution of magnetization as the small angle approximation is not valid for 180°. In the second part of the k-space trajectory, this differential distribution can then be brought closer to the desired zero distribution by presetting the differential distribution, in turn, as the new target distribution of magnetization for equation (2). Then the second, inbound half of the k-space trajectory is used. As the magnetization within the target pattern has a large tip angle but only little transverse magnetization, equation (2) is valid both for the magnetization which has small off-z-axis angles and for the grossly inverted magnetization. This new, non-obvious expansion of the scope of application of equation (2) from the area of small angles to the area of small transverse magnetization (STM) allows quick solution of the remaining problem. This solution yields the SAP and thus the total RF pulse as a linkage of the LAP and the SAP. The resulting distribution of angles of the magnetization after applying this RF pulse using the method according to the invention is shown in FIG. 3 in comparison to the Transmit SENSE method, which involves only small angles, and to the optimal control method. All methods were carried out using the same emitting profiles and the same k-space trajectory. It is apparent that the method according to the invention yields a better result than the Transmit SENSE method and a comparably good result (even better by tendency) in comparison to optimal control. Correspondingly, FIG. 4 shows transverse magnetization by comparison. Again, the results of the method according to the invention are superior to those of the small angle method and comparably good in comparison to optimal control. Clear transverse magnetization at the edge of the target pattern can be seen in all methods and cannot always be avoided, as the tip angle varies quickly between 0 and 180° and must therefore also pass 90°. FIG. 5 shows most clearly how the small angle method deviates from the target distribution of magnetization. The target, i.e. rotation around the x-axis, is most accurately met by the method according to the invention, whereas the small angle method generates massive y-magnetization, which is also within the target pattern.

Figure 6:
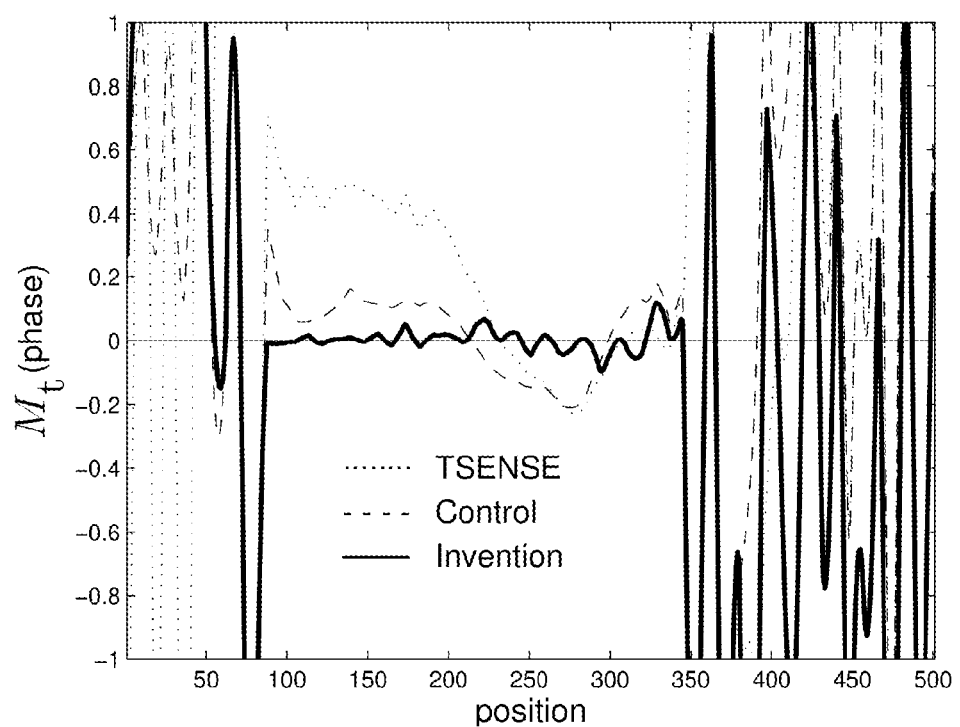
FIG. 6 shows a simulation of the phase of the transverse magnetization Mt along the intersection shown in FIG. 2a with a 155° RF pulse. In this case, the phase of the transverse component of the target distribution of magnetization is zero, as rotation around the x-axis was given. The dotted line represents the Transmit SENSE method, the broken line represents the optimal control method, and the thick solid line represents the method according to the invention. Outside of the excited area, magnetization is near parallel to the z-axis, so the phase is not steadily defined. Therefore, only the area between positions 70 and 340 should be considered when comparing the methods.

Another example is given for a selective RF pulse with a tip angle of 155° around the x-axis. STM approximation cannot be carried out in a second step as the target distribution of magnetization is obviously outside the scope of validity of the STM approximation. A new SAP-LAP sequence is therefore used in this case, which is generated in accordance with the invention as follows. Firstly, the LAP is generated by solving equation (2), wherein the absolute value of Mt(r) is set equal to the target distribution of magnetization with an amplitude of 10°, the phase of Mt(r) is set to zero and the second half of the trajectory shown in FIG. 2b is used for k(r). The resulting RF pulse forms II(t), increased by a factor of 15.5 (the LAP), are then used to integrate backwards from T to T/2 equation (1), using the vectorial target distribution of magnetization as the initial value. If equation (2) was valid for large angles, the distribution of equilibrium (distribution of magnetization where the vectors of the spin magnetization are aligned along the z-axis at all grid points) would equal M(T/2, r). However, this is not the case, and M(T/2, r) still contains deviations from the z-magnetization. These deviations then serve as the new target distribution of magnetization for the SAP in the first half of the k-space trajectory. If the SAP and the LAP are applied (forward) to the complete k-space trajectory, the resulting distribution of magnetization leads to the same conclusions for the various methods as that for 180°. Furthermore, the phase of transverse magnetization can be compared for 155°, as shown in FIG. 6. It is apparent that the target, i.e. rotation around the x-axis, is most accurately met by the method in accordance with the invention, and that the small angle method causes greater phase deviations within the target pattern. Compared with the first example, where an LAP followed by an SAP in STM approximation was used and which is only valid for tip angles near 0° and 180°, this embodiment of the method (SAP followed by an LAP) can be used to generate any target distribution of magnetization.

Figure 7:
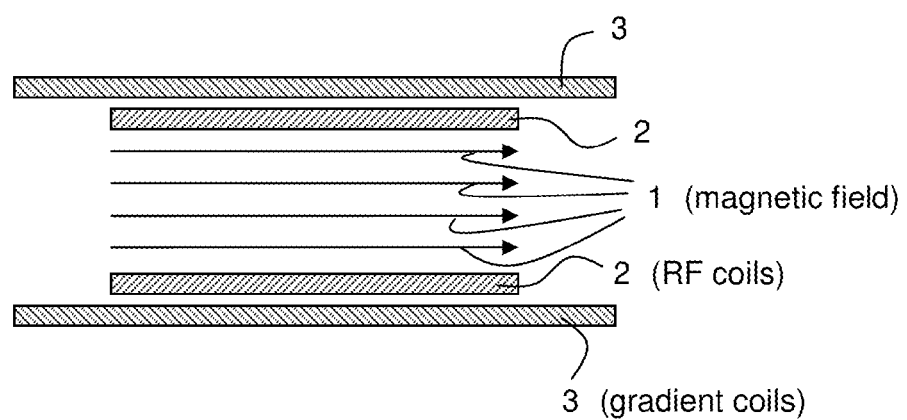
Fig. 7 shows a schematic illustration of an apparatus for use with the inventive method.

Fig. 7 is a schematic illustration of an apparatus for use with the inventive method. A main magnetic field 1 is aligned in a z-direction and is bordered by magnetic gradient coils 3 generating magnetic field gradients. Nuclear spins disposed in the main magnetic field 1 are excited using RF coils 2.

References

[1] P. Ullmann et al., MRM 54, 994-1001 (2005).
[2] S. Conolly et al., Proceedings of the 5th Annual Meeting of SMRM, Montreal, Canada, 1456-1457 (1986).
[3] D. Xu et al., MRM 59, 547-560 (2008).
[4] U. Katscher et al., MRM 49, 144-150 (2003).
[5] Y. Zhu, MRM 51, 775-784 (2004).

We claim:

1. A magnetic resonance method that performs spatially selective excitation and refocusing of nuclear spins disposed within an object under investigation in order to generate a target distribution of magnetization of the nuclear spins from an initial distribution of magnetization of the nuclear spins, the method comprising the steps of:
   a) selecting a first distribution of magnetization, a sequence of radio frequency sub-pulses of independent duration, a main magnetic field aligned along a z-axis, magnetic field gradients and spatial and/or spectral resolution in order to perform spatially selective and frequency selective excitation as well as multi-dimensionally spatially selective excitation of the nuclear spins within the object;
   b) calculating, using a computer having a CPU, a change in the first distribution of magnetization caused by at least one large angle RF pulse (LAP) by complete, full integration of Bloch equations without any small angle approximation, the at least one LAP having a tip angle greater than or equal to 15 degrees in order to generate a second distribution of magnetization approximating a desired distribution of magnetization;
   c) calculating, using the computer having the CPU, at least one small angle RF pulse (SAP) having a tip angle of less than 15 degrees that uses the small angle approximation, the at least one SAP reducing a difference between the desired distribution of magnetization and the second distribution of magnetization caused by the at least one LAP as calculated in step b);
   d) establishing the main magnetic field and the field gradients selected in step a);
   e) disposing the object in the main magnetic field;
   f) exciting the nuclear spins in the object by irradiating, using RF coils, the at least one LAP calculated in step b);
   g) exciting the nuclear spins in the object by irradiating, using the RF coils, the at least one SAP calculated in step c), thereby, together with step f), substantially generating the target distribution of magnetization; and
   h) executing the magnetic resonance method with the substantially generated target distribution of magnetization in order to obtain a magnetic resonance image of the object under investigation.

2. The method of claim 1, wherein the at least one SAP is determined by solving the Bloch equations in Small Transverse Magnetization (STM) approximation, wherein components perpendicular to the z-axis are considerably smaller than a component parallel to the z-axis, the STM approximation being used for nuclear spins which contain magnetization vectors with angles both near to 0° and near to 180° relative to the z-axis.

3. The method of claim 1, wherein the LAP is generated by increasing an amplitude of the calculated Small Angle Pulses (SAP)'s.

4. The method of claim 1, wherein the first distribution of magnetization is the target distribution of magnetization and the desired distribution of magnetization is the initial distribution of magnetization, wherein the LAP is calculated by backward integration of the Bloch equations, starting from the target distribution of magnetization, in order to calculate a change in the first distribution of magnetization caused by the LAP and by setting a difference between the calculated second distribution of magnetization obtained by the backward Bloch integration and the initial distribution of magnetization as a new desired distribution of magnetization to be generated for the SAP.

5. The method of claim 1, wherein the first distribution of magnetization is the initial distribution of magnetization and the desired distribution of magnetization is the target distribution of magnetization, wherein the LAP is calculated by forward integration of the Bloch equations, starting from the initial distribution of magnetization, in order to calculate a change in the first distribution of magnetization caused by the LAP and by setting a difference between the target distribution of magnetization and the calculated second distribution of magnetization obtained by the Bloch integration as a new desired distribution of magnetization to be generated for the SAP.

6. The method of claim 1, wherein the spin magnetization is rotated by 180° from the initial distribution of magnetization where the magnetization vectors are aligned along the z-axis.

7. The method of claim 6,
   wherein the first distribution of magnetization is the target distribution of magnetization and the desired distribution of magnetization is the initial distribution of magnetization,
   wherein the LAP is calculated by backward integration of the Bloch equations, starting from the target distribution of magnetization, and by setting a difference between the thus calculated second distribution of magnetization and the initial distribution of magnetization as a new desired distribution of magnetization to be generated for the SAP.

8. The method of claim 6, wherein the initial distribution of magnetization is rotated by means of an LAP and a subsequent SAP using forward integration of the Bloch equations in order to calculate a change in the first distribution of magnetization caused by the LAP and setting a difference between the initial distribution of magnetization rotated by 180° and the calculated distribution of magnetization obtained by the Bloch integration as a new desired distribution of magnetization to be generated for the SAP.

9. The method of claim 6, wherein the initial distribution of magnetization is rotated by means of a first SAP, followed by an LAP, followed by a second SAP, wherein the LAP is calculated using backward integration of the Bloch equations, starting from the initial distribution of magnetization rotated by 180°, in order to calculate a change in the first distribution of magnetization caused by the LAP and setting a difference between the calculated second distribution of magnetization obtained by the Bloch integration and the initial distribution of magnetization as a new desired distribution of magnetization to be generated for the first SAP, and using forward integration of the Bloch equations for a first SAP-LAP sequence, starting from the initial distribution of magnetization, in order to calculate a change in the first distribution of magnetization caused by the SAP-LAP sequence and by setting a difference between the initial distribution of magnetization rotated by 180° and the calculated second distribution of magnetization obtained by the SAP-LAP Bloch integration as a new desired distribution of magnetization to be generated for the second SAP.

10. The method of claim 1, wherein spin magnetization is converted from an initial distribution of magnetization, via a distribution of magnetization, where the magnetization vectors are aligned along the z-axis, into the target distribution of magnetization using an LAP, followed by an SAP, in order to shift the spin magnetization to a distribution of magnetization where the magnetization vectors are aligned along the z-axis, followed by an SAP-LAP sequence which generates the target distribution of magnetization.

11. The method of claim 10, where two sequential SAPs are combined in order to form one SAP which is shorter than the two sequential SAPs.

12. The method of claim 10, wherein the target distribution of magnetization is identical with a distribution of magnetization reflected in a plane containing the z-axis, wherein the target distribution mirrors the initial distribution of magnetization.

13. The method of claim 11, wherein the target distribution of magnetization is identical with a distribution of magnetization reflected in a plane containing the z-axis, wherein the target distribution mirrors the initial distribution of magnetization.

14. The method of claim 1, wherein an overall pulse sequence is applied to nuclear spins whose initial distribution of magnetization is different from both the first distribution and from the desired distribution.

* * * * *